United States Patent
Porter et al.

(10) Patent No.: US 10,998,919 B2
(45) Date of Patent: May 4, 2021

(54) CODED STREAM PROCESSING

(71) Applicant: Microsoft Technology Licensing, LLC, Redmond, WA (US)

(72) Inventors: Todd Robert Porter, Seattle, WA (US); Xin Tian, Seattle, WA (US); Alexander Alperovich, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/590,461

(22) Filed: Oct. 2, 2019

(65) Prior Publication Data

US 2021/0105024 A1 Apr. 8, 2021

(51) Int. Cl.
*H03M 13/09* (2006.01)
*G06F 9/54* (2006.01)

(52) U.S. Cl.
CPC .............. *H03M 13/09* (2013.01); *G06F 9/54* (2013.01)

(58) Field of Classification Search
CPC ................................. H03M 13/09; G06F 9/54
See application file for complete search history.

(56) References Cited

U.S. PATENT DOCUMENTS

| | | | |
|---|---|---|---|
| 10,320,421 B2 | 6/2019 | Freudenberger et al. | |
| 10,423,358 B1 * | 9/2019 | Foo | G06F 3/0631 |
| 2007/0143359 A1 * | 6/2007 | Uppala | G06F 11/1004 |
| 2008/0151776 A1 | 6/2008 | Kure | |
| 2012/0060072 A1 | 3/2012 | Simitci et al. | |
| 2013/0322567 A1 | 12/2013 | Yu et al. | |
| 2014/0222964 A1 | 8/2014 | Leong et al. | |
| 2014/0279895 A1 | 9/2014 | Mehra et al. | |
| 2014/0310571 A1 | 10/2014 | Fetterly et al. | |

(Continued)

FOREIGN PATENT DOCUMENTS

EP 3014450 A1 5/2016

OTHER PUBLICATIONS

Y. Chen, Y. Xu, Y. Li and J. Xu, "Balanced Parity Update Algorithm with Queueing Length Awareness for RAID Arrays," 2016 IEEE 22nd International Conference on Parallel and Distributed Systems (ICPADS), Wuhan, 2016, pp. 818-825. (Year: 2016).*

(Continued)

*Primary Examiner* — Kyle Vallecillo
(74) *Attorney, Agent, or Firm* — Rainier Patents, P.S.

(57) ABSTRACT

Described herein is a system and method for coded streaming data to facilitate recovery from failed or slow processor(s). A batch of processing stream data can be partitioned into a plurality of data chunks. Parity chunk(s) for the plurality of data chunks. The plurality of data chunks and the parity chunk(s) can be provided to processors for processing. Processed data of at least some (e.g., one or more) of the plurality of data chunks, and, processed data of parity chunk(s) are received. When it is determined that processed data for a pre-defined quantity of data chunks has not been received by a pre-defined period of time, the processed data for particular data chunk(s) of particular processor(s) from which processed data has not been received are determined based, at least in part, upon the received processed parity chunk(s) and the received processed data chunk(s).

20 Claims, 8 Drawing Sheets

(56) References Cited

U.S. PATENT DOCUMENTS

| | | | |
|---|---|---|---|
| 2015/0149819 A1* | 5/2015 | Lee | G06F 11/1076 |
| | | | 714/6.24 |
| 2016/0359940 A1 | 12/2016 | Chen et al. | |
| 2018/0069661 A1 | 3/2018 | Koenig | |
| 2018/0181471 A1 | 6/2018 | Panta et al. | |
| 2018/0246793 A1* | 8/2018 | Jin | G06F 11/2094 |
| 2018/0262408 A1 | 9/2018 | Alperovich et al. | |
| 2018/0267854 A1* | 9/2018 | Ki | G06F 3/065 |
| 2018/0307560 A1 | 10/2018 | Vishnumolakala et al. | |
| 2019/0007060 A1 | 1/2019 | Vafin et al. | |
| 2019/0235949 A1 | 8/2019 | Kelly et al. | |
| 2019/0294501 A1* | 9/2019 | Gajbhiye | G06F 21/554 |
| 2020/0034339 A1* | 1/2020 | Gershaneck | G06F 16/137 |
| 2020/0097445 A1* | 3/2020 | Grimaldi | G06F 16/909 |
| 2020/0241781 A1* | 7/2020 | Patel | G06F 3/067 |
| 2020/0241782 A1* | 7/2020 | Patel | G06F 3/0641 |

OTHER PUBLICATIONS

Klockowski, Richard, et al., "Autonomous Data Error Detection and Recovery in Streaming Applications", International Conference on Computation Science, ICCS 2013, 2013, 10 pages.

Wicker, Stephen B., et al., "An Introduction to Reed-Solomon Codes", 1994, 16 pages.

"International Search Report and Written Opinion Issued in PCT Application No. PCT/US2020/046727", dated Nov. 18, 2020, 13 Pages.

\* cited by examiner

CODED STREAM PROCESSING

BACKGROUND

Stream processing allows multiple data streams from multiple sources to be processed in real-time. "Streaming" or stream processing refers to receiving streams of data, processing the data by multiple processors and streaming the processed data back out as a single flow.

SUMMARY

Described herein is a system for coded streaming data, comprising: a processing system comprising a processor and a memory having computer-executable instructions stored thereupon which, when executed by the processor, cause the processing system to: receive processed data of at least some of a plurality of data chunks; receive processed data of at least one parity chunk; when it is determined that processed data for a pre-defined quantity of data chunks has not been received by a pre-defined period of time, determine the processed data for one or more particular data chunks of one or more particular processors from which processed data has not been received based, at least in part, upon the received processed data of the at least one parity chunk and the received processed data of the at least some of the plurality of data chunks; and provide the received processed plurality of data chunks and the determined processed data.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Various technologies pertaining to coded stream processing are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

The subject disclosure supports various products and processes that perform, or are configured to perform, various actions regarding coded stream processing. What follows are one or more exemplary systems and methods.

Aspects of the subject disclosure pertain to the technical problem of error correction for stream processing. The technical features associated with addressing this problem involve partitioning a batch of processing stream data into the plurality of data chunks; generating at least one parity chunk for the plurality of data chunks; providing the plurality of data chunks and the one or more parity chunks to processors for processing; receiving processed data of at least some of the plurality of data chunks; receiving processed data of at least one parity chunk; when it is determined that processed data for a pre-defined quantity of data chunks has not been received by a pre-defined period of time, determining the processed data for one or more particular data chunks of one or more particular processors from which processed data has not been received based, at least in part, upon the received processed data of the at least one parity chunk and the received processed data of the at least some of the plurality of data chunks; and providing the received processed plurality of data chunks and the determined processed data. Accordingly, aspects of these technical features exhibit technical effects of more efficiently and effectively recovering from failure(s) or slow processing of processor(s) (e.g., computing nodes) of a stream processing system, for example, reducing consumption of network bandwidth and/or computing node processing resource(s).

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system," as well as various forms thereof (e.g., components, systems, sub-systems, etc.) are intended to refer to a computer-related entity, either hardware, a combination of hardware and software, software, or software in execution. For example, a component may be, but is not limited to being, a process running on a processor, a processor, an object, an instance, an executable, a thread of execution, a program, and/or a computer. By way of illustration, both an application running on a computer and the computer can be a component. One or more components may reside within a process and/or thread of execution and a component may be localized on one computer and/or distributed between two or more computers. Further, as used herein, the term "exemplary" is intended to mean serving as an illustration or example of something, and is not intended to indicate a preference.

In some embodiments, the technologies disclosed herein are used in conjunction with pull-based stream processing employing anchor-based technology that facilitates once and only once processing by output processor(s). An "anchor" is generated by an input processor (e.g., along with data of an output stream) and describes a point in the output stream of the input processor, so that other unit(s) of data in the output stream are either before or after any given anchor. For purposes of discussion, data "flows" downstream from an input processor through any intermediate computing processor(s) to an output processor. A request for data is sent upstream from an output processor through any intermediate computing processor(s) to an input processor.

In order to reduce latency, streaming data can be partitioned into data chunks, with each of the data chunks processed in parallel by processors (e.g., of an intermediate computing processor). When performing parallel processing of streaming data, some processor(s) for the partition(s) can fail for a period of time and/or some processor(s) may be slower due to hardware and/or software issues, noisy neighbors, etc.

Described herein is a system and method for coding streaming data to include one or more parity chunks. In the event that processed streaming data is not timely received from one or more processor(s), a coded sink can utilize the parity chunk(s) to derive processed streaming data associated with the one or more processor(s) from which processed streaming data has not been received. The coded sink can then provide the derived processed streaming along with received processed streaming data. By coding the streaming data, the system can tolerate a pre-defined quantity of problematic processor(s) and/or communication path(s), thus allowing for processing of the streaming data without significant increased latency and/or interruption.

Figure 1:
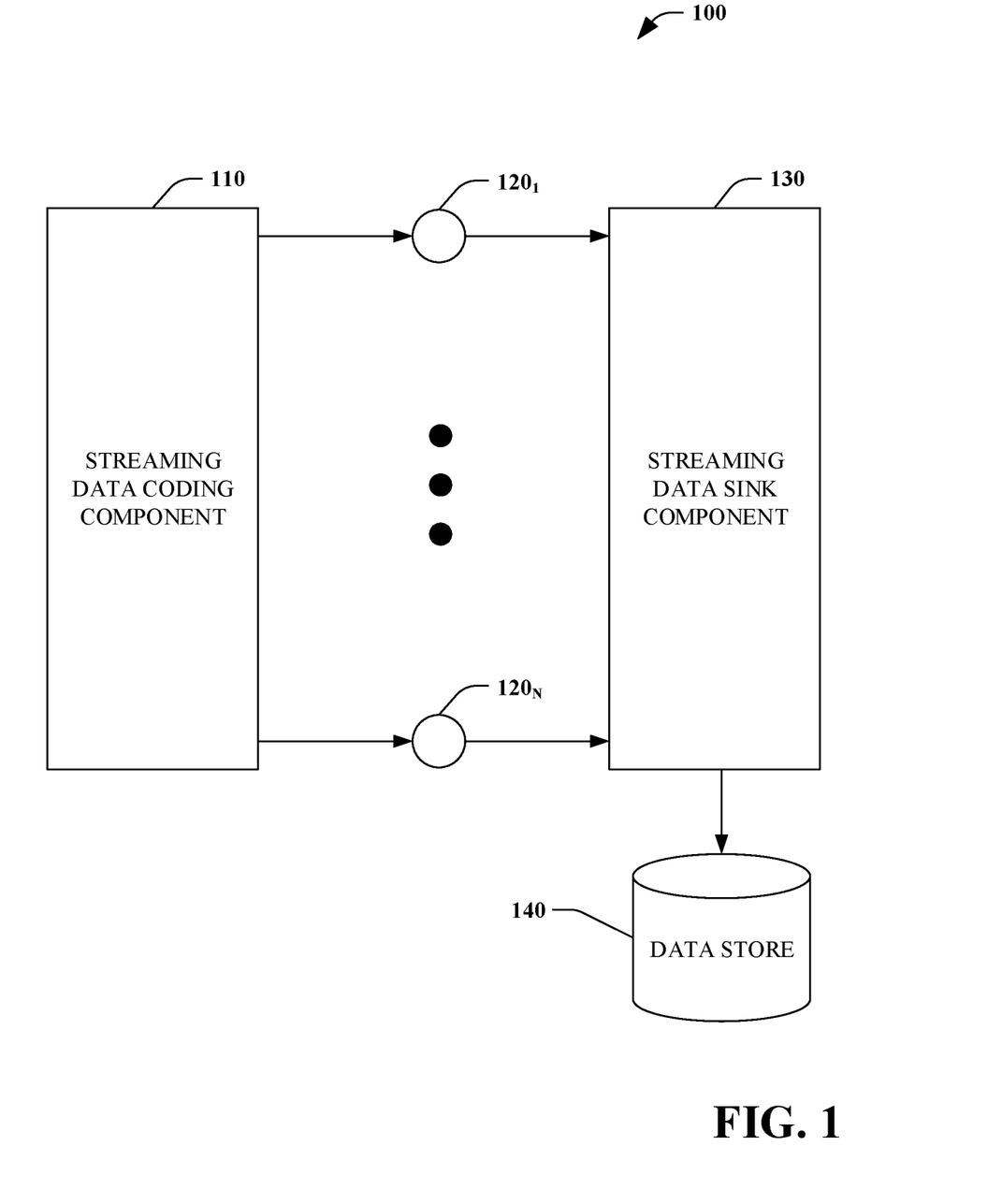
FIG. 1 is a functional block diagram that illustrates a system for coded streaming data.

Referring to FIG. 1, a system for coded streaming data 100 is illustrated. The system 100 includes a streaming data coding component 110, a plurality of processors 120, and a streaming data sink component 130. The streaming data coding component 110 and the streaming data sink component 130 utilize a coding scheme in order to successfully recover from failure and/or untimely arrival of processed data from one or more processors 120.

In some embodiments, the streaming data coding component 110 is a component of an input node (not shown) of a streaming data processing system. For example, a customer can utilize a coded client library when sending data to the plurality of processors 120. In some embodiments, the streaming data coding component 110 is a component of a compute node/intermediate node (not show) of a streaming data process system.

In the event that processed streaming data is not timely received from one or more processor(s) 120, the streaming data sink component 130 can utilize coding information (e.g., parity chunk(s)) to derive streaming data associated with the one or more processor(s) 120 from which processed streaming data has not been timely received. The streaming data sink component 130 can then provide the derived streaming data (e.g., in place of the one or more processor(s) 120 from which processed streaming data has not been timely received) along with processed streaming data from other processor(s) 120, for example, to a data store 140. In this manner, the system 100 system can tolerate a pre-defined quantity of problematic processor(s) 120, thus allowing for processing of the streaming data without significant interruption.

Figure 2:
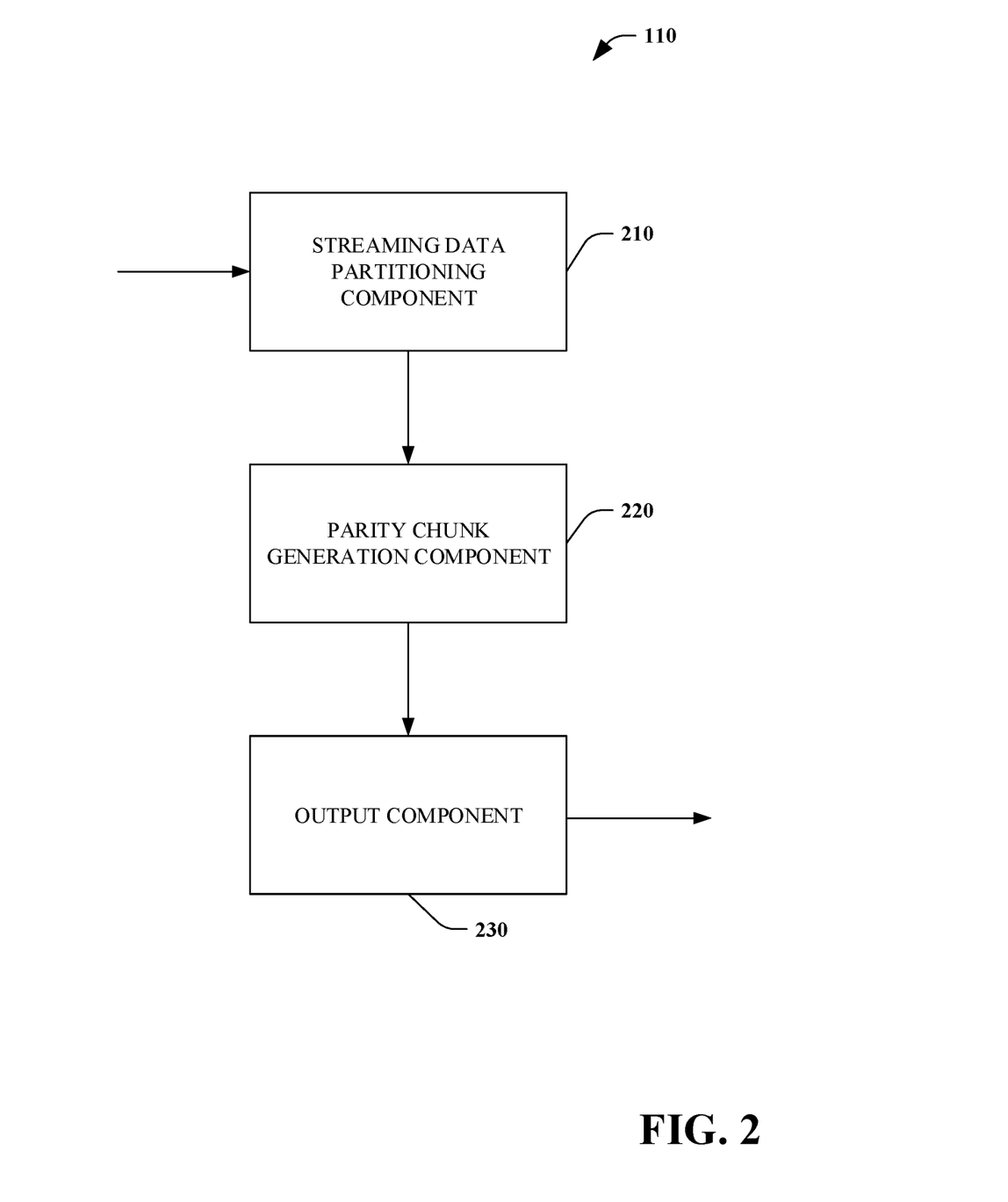
FIG. 2 is a functional block diagram that illustrates a streaming data coding component.

Turning to FIG. 2, a streaming data coding component 110 is illustrated. Received streaming data is partitioned (e.g., divided) into a plurality of chunks (M data chunks) by a streaming data partitioning component 210. In some embodiments, the quantity of chunks (M) is predefined, for example, based, at least in part, upon a number of processors 120.

Next, a parity chunk generation component 220 generates one or more parity chunks (P parity chunks) associated with the plurality of chunks using a parity algorithm. In some embodiments, a Reed-Solomon parity algorithm is employed. Reed-Solomon derives redundancy data from coefficients of a polynomial (e.g., of degree M) generated by multiplying the data with a generator polynomial. In some embodiments, Reed-Solomon represents a maximally efficient scenario for M units of data with P units of redundancy data (e.g., total units processed K=M+P). In particular, given a number of units of data chunks M and a failure tolerance P, Reed-Solomon generates and P units of redundancy data. Reed-Solomon provides the minimum amount of redundancy data (e.g., K=M+P) that can be used to enable recovery of the data in the event that P failures occur (e.g., P unit(s) of data are missing and/or processor(s) 120 failed). In the event of a need to perform data recovery, values that remain available may be plugged back into the polynomial expression/algorithm to solve for missing values and accordingly reconstruct missing data.

For purposes of explanation and not limitation, consider a scenario in which six data units (M=6) is utilized. In this scenario, a representative Reed-Solomon example for six data units (D0, D1, D2, D3, D4, D5) and a failure tolerance of two (P1, P2), where exemplary polynomials for the parity chunks P1 and P2 are:

$$P_0 = D_0 + D_1 + D_2 + D_3 + D_4 + D_5 \qquad \text{Eq. (1)}$$

$$P_1 = g^0 D_0 + g^1 D_1 + g^2 D_2 + g^3 D_3 + g^4 D_4 + g^5 D_5 \qquad \text{Eq. (2)}$$

with the $g^x$ values being configurable coefficients for the polynomials. In this scenario, a failure tolerance of two is recoverable. For example, if all six data units are received and the two parity units fail, there is no need for the parity units; however, the parity units can be re-generated based on equations (1) and (2). If a single data unit is not received, for example D1, given P0 and P1, one of the two linear equations (1) and (2) can be solved for D1. If two data units are not received, for example, D1 and D2, given P0 and P1, the two linear equations (1) and (2) can be solved for D1 and D2.

In some embodiments, the number of parity chunks generated is proportional to the quantity of untimely received processed data (e.g., failed and/or slow processors 120) from which the streaming data sink component 130 can recover. That is, a single parity chunk can be utilized to recover from a single failed processor 120, two parity chunks can be utilized to recover from up to two failed processors 120, etc. In some embodiments, an increase in the quantity of parity chunks increases transmission costs and/or processing costs.

In some embodiments, the one or more parity chunks are generated over all of the plurality of data chunks (M chunks). For example, streaming data can be partitioned into one hundred data chunks and two parity chunks generated over the one hundred data chunks. The system 100 can tolerate at most two failed (or slow) processors 120 out of the one hundred and two processors 120 (when parity chunks are processed separately from data chunks) or one hundred processor 120 (when parity chunks are processed with data chunks). In the event of untimely receipt of processed data, processing by the streaming data sink component 130 can involve processed data received from the other processors 120 including received processed parity chunks. Latency associated with data recovery performed by the streaming data sink component 130 increases proportional to the quantity of data chunks associated with the parity chunks.

In some embodiments, the plurality of data chunks are grouped into parity groups with one or more parity chunks generated for the data chunks belonging to a particular parity group. By generating parity chunks for groups, processing by the streaming data sink component 130 in the event of untimely receipt of processed data can be limited to data of the particular group and use of parity chunk(s) associated with the particular group.

Once the streaming data has been partitioned into data chunks and one or more parity chunks generated, an output component 230 can provide the data chunks and/or parity chunk(s) to the processors 120. In some embodiments, a parity chunk is included with a data chunk (e.g., appended to) when provided to a processor 120. In some embodiments, the processor 120 processes the parity chunk along with the data chunk. In some embodiments, the parity chunk(s) are provided separately to processor(s) 120.

Figure 3:
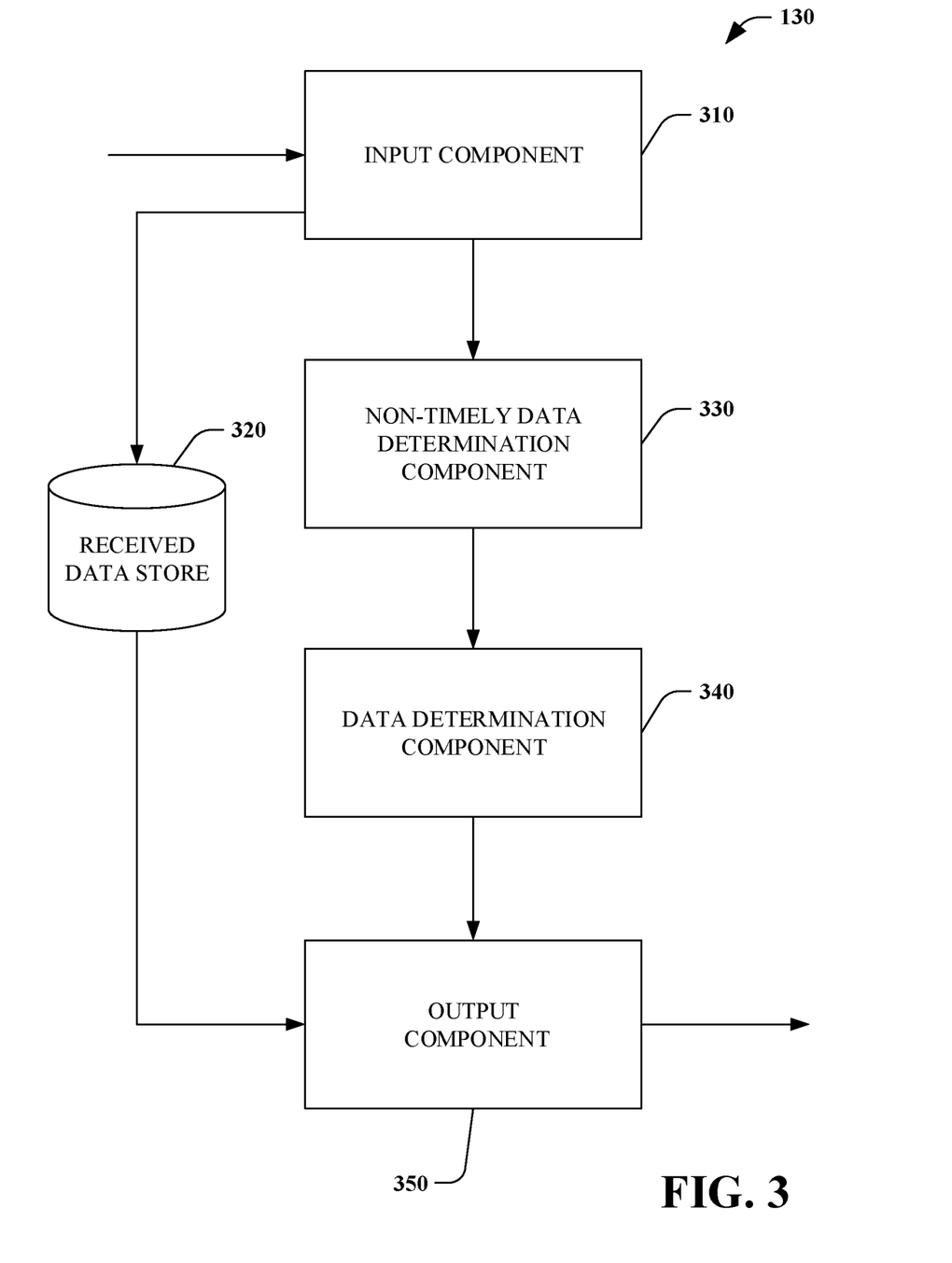
FIG. 3 is a functional block diagram that illustrates a streaming data sink component.

Next, referring to FIG. 3, a streaming data sink component 130 is illustrated. Processed data is received from processors 120 by an input component 310 which stores the data in a received data store 320.

A non-timely data determination component 330 monitors receipt of processed data in view (e.g., processed data received from x number of processors 120) of expected data (e.g., M processors 120). The non-timely data determination component 330 can determine that processed data has not been received from a pre-defined quantity of processors 120 by a pre-defined period of time. For example, less than all but greater than a pre-defined quantity of processed data chunks (or processed data chunks of a particular group) have not been received from one or more particular processors 120 by the pre-defined period of time.

In some embodiments, the pre-defined quantity of processed data chunks is the number of data chunks expected (M) less the number of processed parity chunk(s) received, thus enabling the non-timely data determination component 330 to recover/process data chunk(s) associated with the particular processor(s) 120 from which process data chunks have not been received.

In some embodiments, the pre-defined quantity of processed data chunks is the number of data chunks expected for a group minus the number of parity chunk(s) received for the group, thus enabling the non-timely data determination component 330 to recover/process data chunk(s) associated with the particular processors 120 from which process data chunks have not been received.

In some embodiments, the pre-defined period of time is based, at least in part, upon an expected amount of time to recover/process data chunk(s) for untimely (e.g., failed/slow) processor(s) 120 (e.g., based upon historical data associated with performance the streaming data sink component 130) in view of latency and/or performance requirement(s) of a service level agreement (SLA) for processing of streaming data. In some embodiments, the pre-defined period of time is based, at least in part, upon a quantity of data chunks in a group and/or a quantity of parity chunk(s) to be used to recover/process data chunk(s) for untimely (e.g., failed/slow) processor(s) 120.

In some embodiments, the pre-defined period of time is static. In some embodiments, the pre-defined period of time is dynamically adjusted based upon current processing condition(s) of the processors 120. In some embodiments, the pre-defined period of time is based, at least in part, upon user-configurable setting(s). For example, a user can request the use of additional (or less) parity block(s) which can result in increased (or decreased) processing and/or transmission costs.

When the non-timely data determination component 330 determines processed data has not been received from the pre-defined quantity of processors 120 by the pre-defined period of time, a data recovery process can be started. A data determination component 330 can determine the processed data for data chunk(s) of particular processor(s) from which processed data has not been received (e.g., failed or slow processor(s) 120) using the received processed one or more parity chunks and the received processed data, as discussed above. For example, when processed data for one data chunk has not been received, one parity block can be used. When processed data for two data chunks has not been received, two parity blocks can be used, etc.

Once the processed data for data chunk(s) of the particular processor(s) from which processed data has not been received (e.g., failed processor(s) 120) has been determined, an output component 350 can combine the processed data derived by the data determination component 330 with the received processed data (e.g., stored in the received data store 320) and provide the combined processed data, for example, to the data store 140.

By efficiently and effectively selecting a quantity of data chunks and an associated quantity of parity blocks, the system 100 can balance cost and/or latency requirements. In some embodiments, by selecting and/or dynamically adjusting grouping strategies (e.g., number of data chunks per number of parity block(s)) and the period of time at which recovery efforts are begun, the system 100 can effectively respond to unexpected parallel processing issues (e.g., failed processor 120, slow processor 120, and/or failed/noisy communication path(s)).

FIGS. 4-7 illustrate exemplary methodologies relating to coded stream processing. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Figure 4:
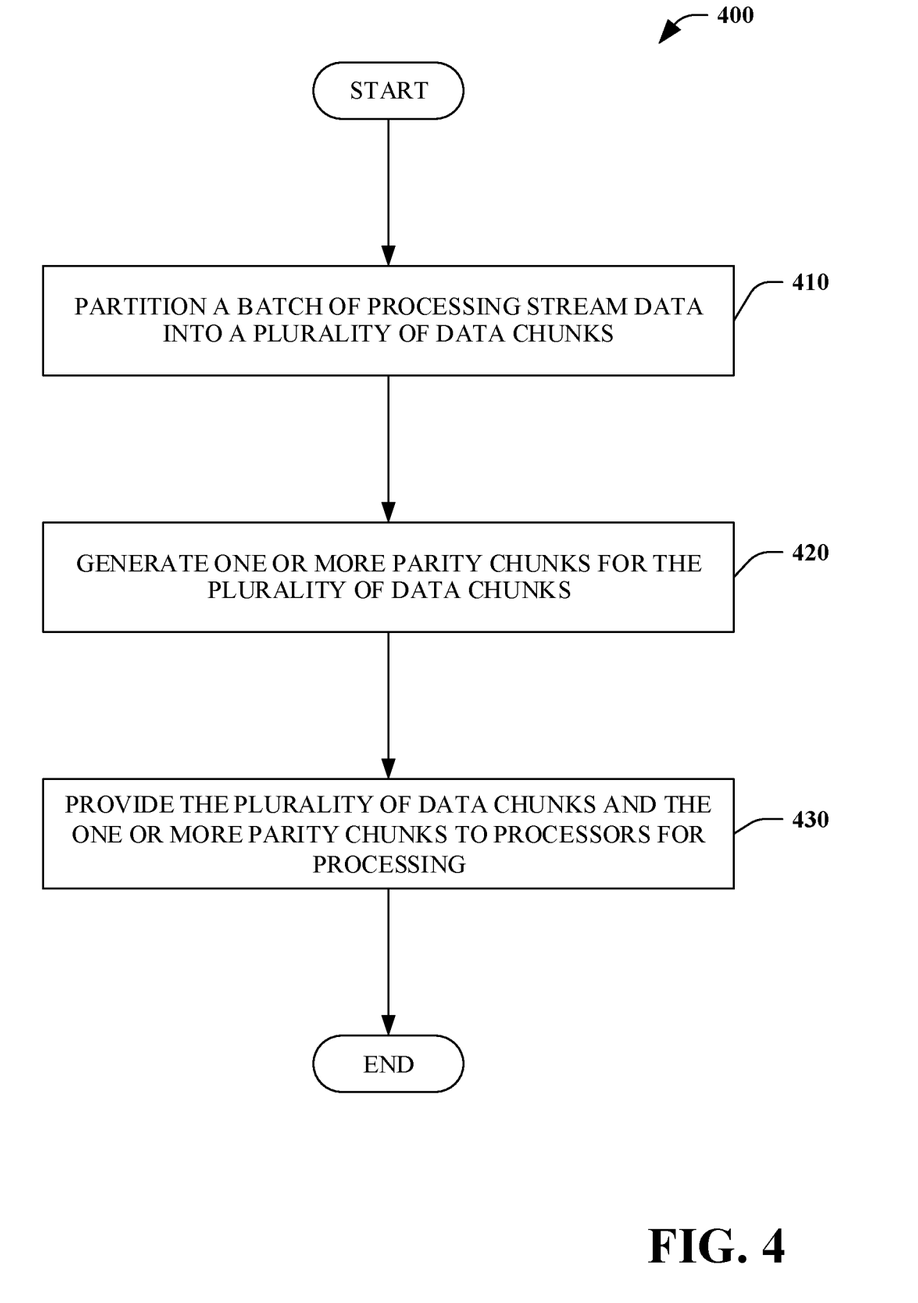
FIG. 4 is a flow chart that illustrates a method of coding streaming data.

Referring to FIG. 4, a method of coding streaming data 400 is illustrated. In some embodiments, the method 400 is performed by the streaming data coding component 110.

At 410, a batch of processing stream data is partition into a plurality of data chunks. At 420, one or more parity chunks is generated for the plurality of data chunks. The plurality of data chunks and the one or more parity chunks are provided to processors for processing.

Figure 5:
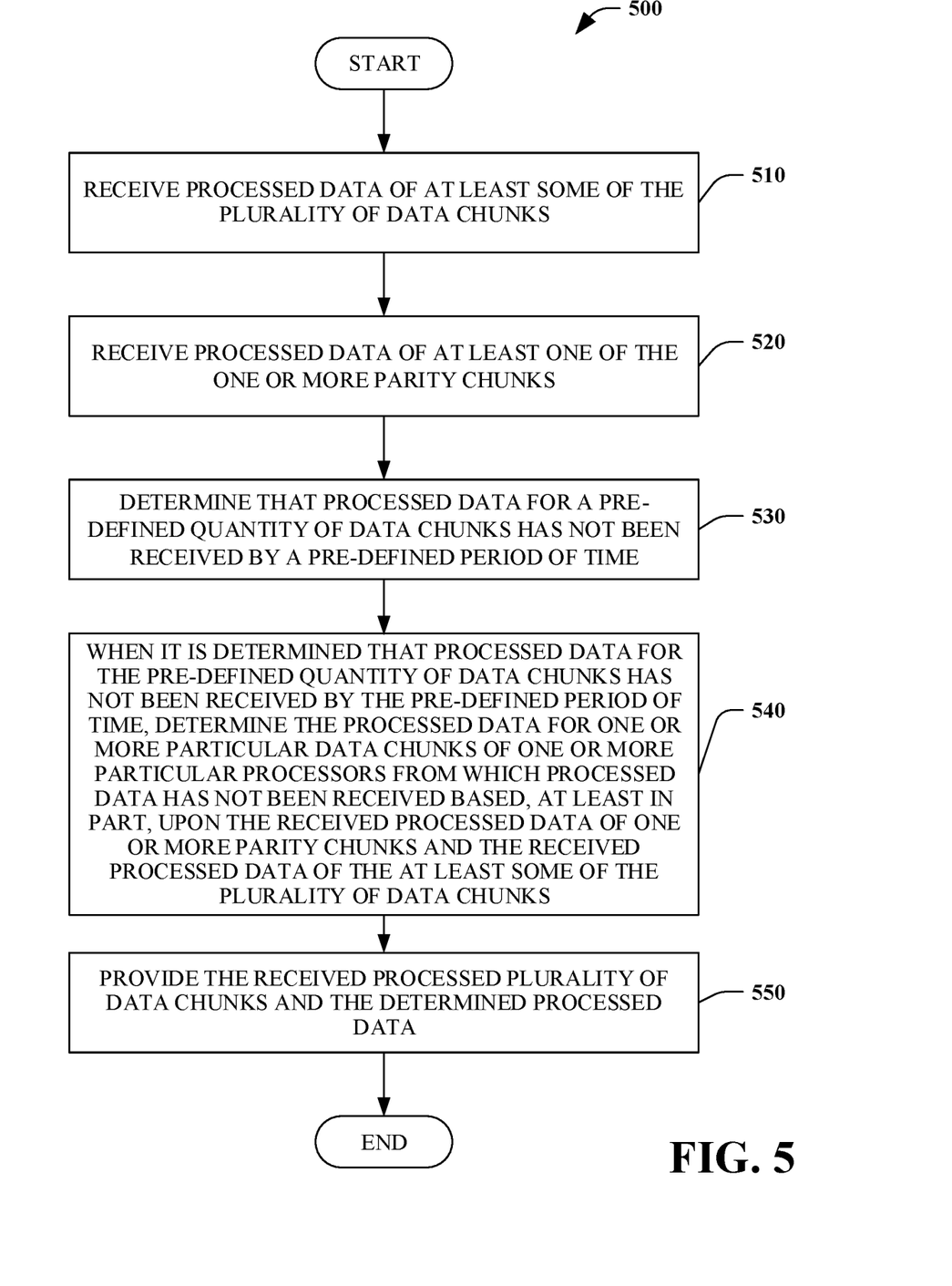
FIG. 5 is a flow chart that illustrates a method of coded streaming data processing.

Turning to FIG. 5, a method of coded streaming data processing 500 is illustrated. In some embodiments, the method 500 is performed by the streaming data sink component 130.

At 510, processed data of at least some (e.g., one or more data chunks) of the plurality of data chunks is received. At 520, processed data of at least one of the one or more parity chunks is received.

At 530, it is determined that processed data for a pre-defined quantity of data chunks has not been received by a pre-defined period of time. At 540, when it is determined that processed data for the pre-defined quantity of data chunks has not been received by the pre-defined period of time, the processed data for one or more particular data chunks of one or more particular processors from which processed data has not been received is determined based, at least in part, upon the received processed data of the at least one or more parity chunks and the received processed data of the at least some of the plurality of data chunks. At 540, the received processed plurality of data chunks and the determined processed data is provided (e.g., stored).

Figure 6:
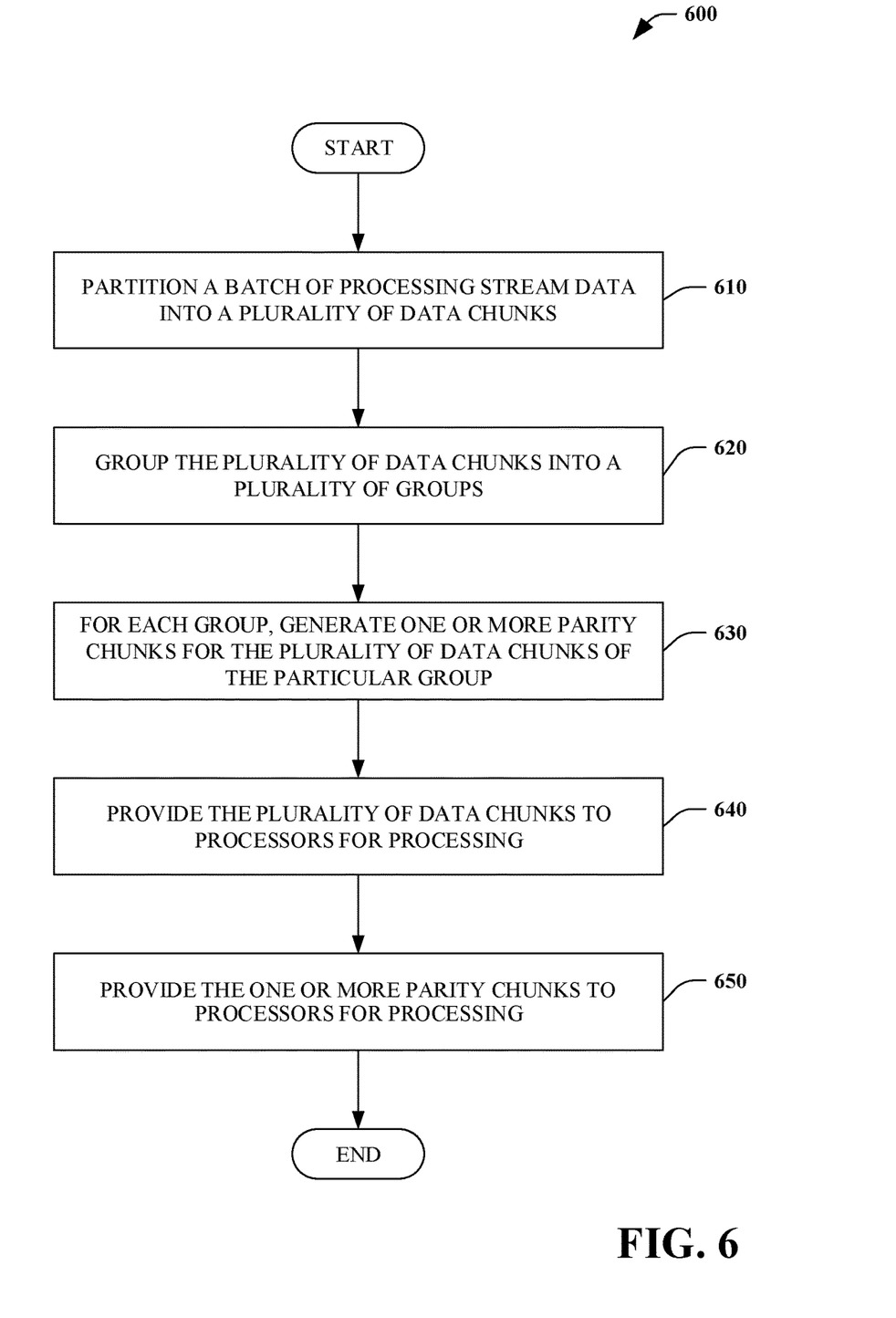
FIG. 6 is a flow chart that illustrates a method of coding streaming data.

Next, referring to FIG. 6, a method of coding streaming data 600 is illustrated. In some embodiments, the method 600 is performed by the streaming data coding component 110.

At 610, a batch of processing stream data into a plurality of data chunks is partitioned. At 620, the plurality of data chunks is grouped into a plurality of groups. At 630, for each group, one or more parity chunks for the plurality of data chunks of the particular group is generated. At 640, the plurality of data chunks is provided to processors for processing. At 650, the one or more parity chunks are provided to processor(s) for processing.

Figure 7:
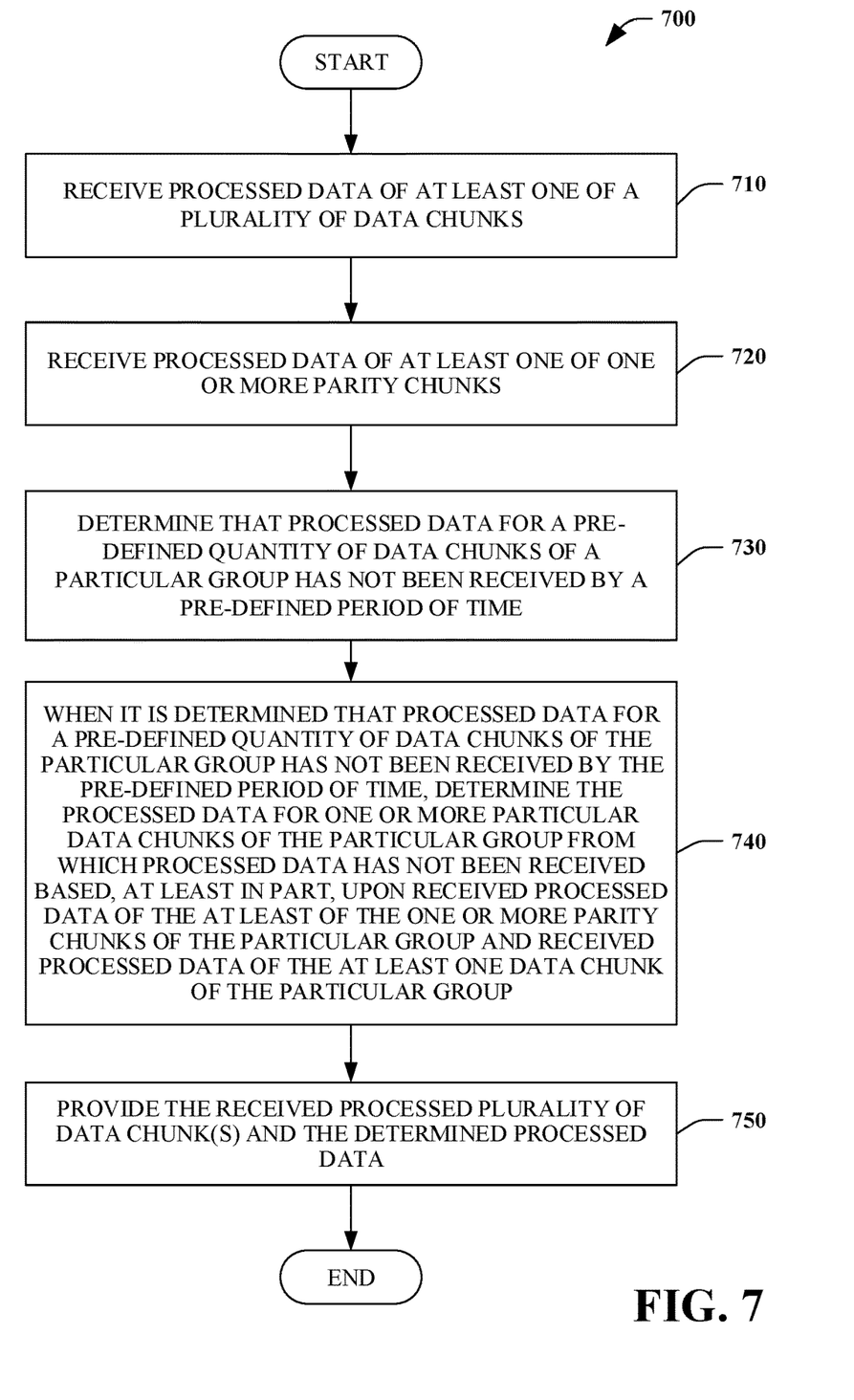
FIG. 7 is a flow chart that illustrates a method of coded streaming data processing.

Turning to FIG. 7, a method of coded streaming data processing 700 is illustrated. In some embodiments, the method 700 is performed by the streaming data sink component 130.

At 710, receiving processed data of at least one of a plurality of data chunks is received. At 720, processed data of at least one of one or more parity chunks is received.

At 730, it is determined that processed data for a pre-defined quantity of data chunks of a particular group has not been received by a pre-defined period of time. At 740, when it is determined that processed data for the pre-defined quantity of data chunks of a particular group has not been received by the pre-defined period of time, the processed data for one or more particular data chunks of the particular group from which processed data has not been received is determined based, at least in part, upon received processed data of the one or more parity chunks of the particular group and received processed data of the at least one data chunk of the particular group. At 740, the received processed plurality of data chunk(s) and the determined processed data are provided (e.g., stored).

Described herein is a system for coded streaming data, comprising: a processing system comprising a processor and a memory having computer-executable instructions stored thereupon which, when executed by the processor, cause the processing system to: receive processed data of at least some of a plurality of data chunks; receive processed data of at least one parity chunk; when it is determined that processed data for a pre-defined quantity of data chunks has not been received by a pre-defined period of time, determine the processed data for one or more particular data chunks of one or more particular processors from which processed data has not been received based, at least in part, upon the received processed data of the at least one parity chunk and the received processed data of the at least some of the plurality of data chunks; and provide the received processed plurality of data chunks and the determined processed data.

The system can include the memory having further computer-executable instructions stored thereupon which, when executed by the processor, cause the processing system to: partition a batch of processing stream data into the plurality of data chunks; generate the at least one parity chunk for the plurality of data chunks; and provide the plurality of data chunks and the one or more parity chunks to processors for processing.

The system can further include wherein the pre-defined quantity of data chunks is based, at least in part, upon a quantity of data chunks for which processed data has been received. The system can further include wherein the pre-defined quantity of data chunks is based, at least in part, upon a quantity of parity data chunks for which processed data has been received. The system can further include wherein the at least one parity chunk is generated based upon a Reed-Solomon parity algorithm.

The system can further include wherein the plurality of data chunks are processed substantially in parallel. The system can further include wherein the pre-defined period of time is based, at least in part, upon a quantity of data chunks into which streaming data is partitioned and a quantity of parity chunks generated. The system can further include wherein the pre-defined period of time is dynamically adjusted based, at least in part, at least one of an expected amount of time to determine the processed data for the one or more particular data chunks from which processed data has not been received, a latency requirement, or a performance requirement.

Described herein is a method of coded streaming data processing, comprising: receiving processed data of at least some of a plurality of data chunks; receiving processed data of at least one parity chunk; when it is determined that processed data for a pre-defined quantity of data chunks has not been received by a pre-defined period of time, determining the processed data for one or more particular data chunks of one or more particular processors from which processed data has not been received based, at least in part, upon the received processed data of at least one parity chunk and the received processed data of at least some of the plurality of data chunks; and providing the received processed plurality of data chunks and the determined processed data.

The method can further include partitioning a batch of processing stream data into the plurality of data chunks; generating the at least one parity chunk for the plurality of data chunks; and providing the plurality of data chunks and the one or more parity chunks to processors for processing. The method can further include wherein the pre-defined quantity of data chunks is based, at least in part, upon a quantity of data chunks for which processed data has been received. The method can further include wherein the pre-defined quantity of data chunks is based, at least in part, upon a quantity of parity data chunks for which processed data has been received.

The method can further include wherein the at least one parity chunk is generated based upon a Reed-Solomon parity algorithm. The method can further include wherein the pre-defined period of time is based, at least in part, upon a quantity of data chunks into which streaming data is partitioned and a quantity of parity chunks generated. The method can further include wherein the pre-defined period of time is dynamically adjusted based, at least in part, an expected amount of time to determine the processed data for the one or more particular data chunks from which processed data has not been received.

Described herein is a computer storage media storing computer-readable instructions that when executed cause a computing device to: receive processed data of at least some of a plurality of data chunks; receive processed data of at least one parity chunk; when it is determined that processed data for a pre-defined quantity of data chunks has not been received by a pre-defined period of time, determine the processed data for one or more particular data chunks of one or more particular processors from which processed data has not been received based, at least in part, upon the received processed data of at least one parity chunk and the received processed data of at least some of the plurality of data chunks; and provide the received processed plurality of data chunks and the determined processed data.

The computer storage media can store further computer-readable instructions that when executed cause a computing device to: partition a batch of processing stream data into the plurality of data chunks; generate the at least one parity chunk for the plurality of data chunks; and provide the plurality of data chunks and the one or more parity chunks to processors for processing.

The computer storage media can further include wherein the pre-defined quantity of data chunks is based, at least in part, upon a quantity of data chunks for which processed data has been received. The computer storage media can further include wherein the pre-defined quantity of data chunks is based, at least in part, upon a quantity of parity data chunks for which processed data has been received. The computer storage media can further include wherein the at least one parity chunk is generated based upon a Reed-Solomon parity algorithm.

Figure 8:
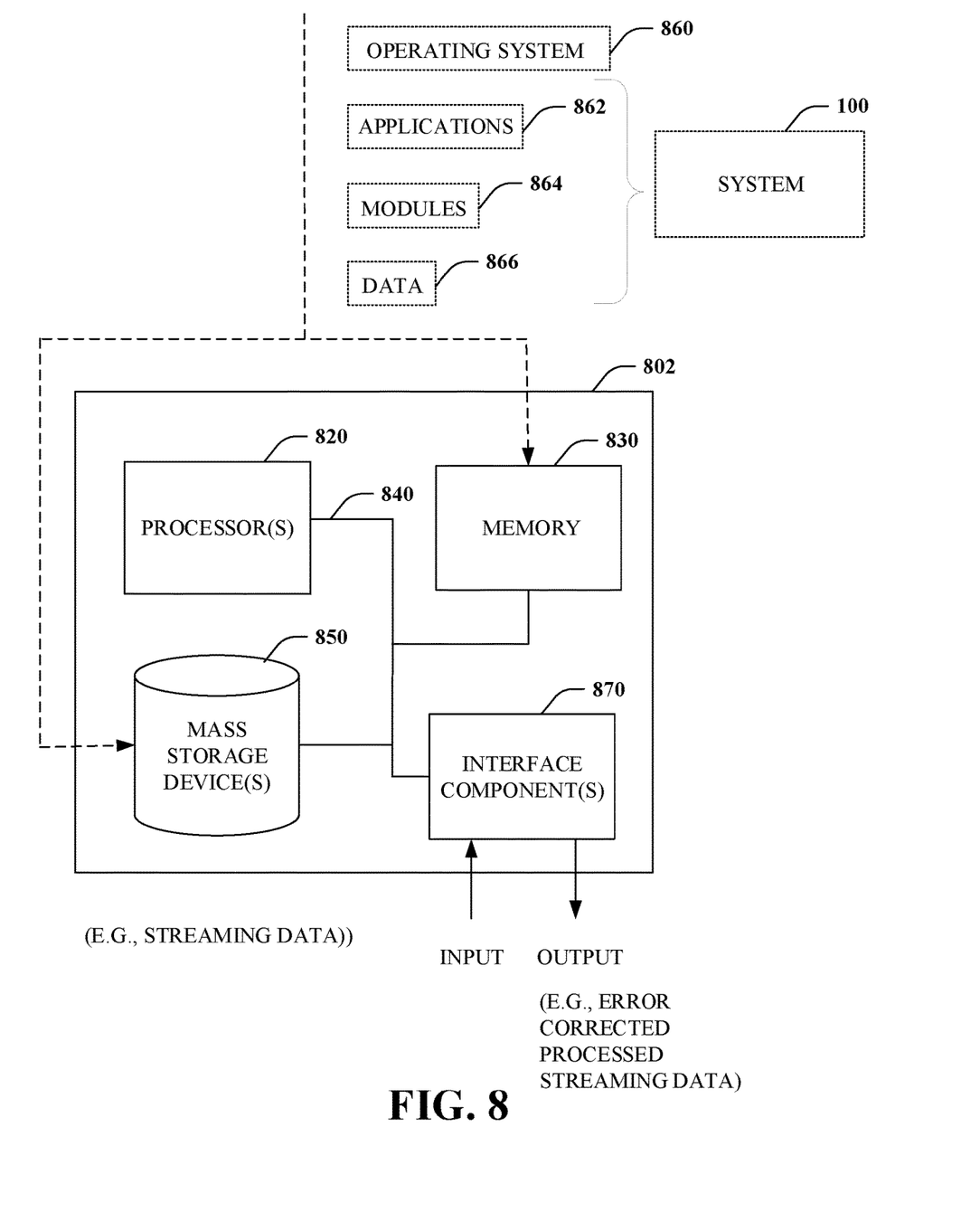
FIG. 8 is a functional block diagram that illustrates an exemplary computing system.

With reference to FIG. 8, illustrated is an example general-purpose computer, processing system, or computing device 802 (e.g., mobile phone, desktop, laptop, tablet, watch, server, hand-held, programmable consumer or industrial electronics, set-top box, game system, compute node, etc.). For instance, the computing device 802 may be used in a system for coded streaming data 100.

The computer 802 includes one or more processor(s) 820, memory 830, system bus 840, mass storage device(s) 850, and one or more interface components 870. The system bus 840 communicatively couples at least the above system constituents. However, it is to be appreciated that in its simplest form the computer 802 can include one or more processors 820 coupled to memory 830 that execute various computer executable actions, instructions, and or components stored in memory 830. The instructions may be, for instance, instructions for implementing functionality described as being carried out by one or more components discussed above or instructions for implementing one or more of the methods described above.

The processor(s) 820 can be implemented with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. The processor(s) 820 may also be implemented as a combination of computing devices, for example a combination of a DSP and a microprocessor, a plurality of microprocessors, multi-core processors, one or more microprocessors in conjunction with a DSP core, or any other such configuration. In one embodiment, the processor(s) 820 can be a graphics processor.

The computer 802 can include or otherwise interact with a variety of computer-readable media to facilitate control of the computer 802 to implement one or more aspects of the claimed subject matter. The computer-readable media can be any available media that can be accessed by the computer 802 and includes volatile and nonvolatile media, and removable and non-removable media. Computer-readable media can comprise two distinct and mutually exclusive types, namely computer storage media and communication media.

Computer storage media includes volatile and nonvolatile, removable and non-removable media implemented in any method or technology for storage of information such as computer-readable instructions, data structures, program modules, or other data. Computer storage media includes storage devices such as memory devices (e.g., random access memory (RAM), read-only memory (ROM), electrically erasable programmable read-only memory (EEPROM), etc.), magnetic storage devices (e.g., hard disk, floppy disk, cassettes, tape, etc.), optical disks (e.g., compact disk (CD), digital versatile disk (DVD), etc.), and solid state devices (e.g., solid state drive (SSD), flash memory drive (e.g., card, stick, key drive) etc.), or any other like mediums that store, as opposed to transmit or communicate, the desired information accessible by the computer 802. Accordingly, computer storage media excludes modulated data signals as well as that described with respect to communication media.

Communication media embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media.

Memory 830 and mass storage device(s) 850 are examples of computer-readable storage media. Depending on the exact configuration and type of computing device, memory 830 may be volatile (e.g., RAM), non-volatile (e.g., ROM, flash memory, etc.) or some combination of the two. By way of example, the basic input/output system (BIOS), including basic routines to transfer information between elements within the computer 802, such as during start-up, can be stored in nonvolatile memory, while volatile memory can act as external cache memory to facilitate processing by the processor(s) 820, among other things.

Mass storage device(s) 850 includes removable/non-removable, volatile/non-volatile computer storage media for storage of large amounts of data relative to the memory 830. For example, mass storage device(s) 850 includes, but is not limited to, one or more devices such as a magnetic or optical disk drive, floppy disk drive, flash memory, solid-state drive, or memory stick.

Memory 830 and mass storage device(s) 850 can include, or have stored therein, operating system 860, one or more applications 862, one or more program modules 864, and data 866. The operating system 860 acts to control and allocate resources of the computer 802. Applications 862 include one or both of system and application software and can exploit management of resources by the operating system 860 through program modules 864 and data 866 stored in memory 830 and/or mass storage device (s) 850 to perform one or more actions. Accordingly, applications 862 can turn a general-purpose computer 802 into a specialized machine in accordance with the logic provided thereby.

All or portions of the claimed subject matter can be implemented using standard programming and/or engineering techniques to produce software, firmware, hardware, or any combination thereof to control a computer to realize the disclosed functionality. By way of example and not limitation, system 100 or portions thereof, can be, or form part, of an application 862, and include one or more modules 864 and data 866 stored in memory and/or mass storage device(s) 850 whose functionality can be realized when executed by one or more processor(s) 820.

In some embodiments, the processor(s) 820 can correspond to a system on a chip (SOC) or like architecture including, or in other words integrating, both hardware and software on a single integrated circuit substrate. Here, the processor(s) 820 can include one or more processors as well as memory at least similar to processor(s) 820 and memory 830, among other things. Conventional processors include a minimal amount of hardware and software and rely extensively on external hardware and software. By contrast, an SOC implementation of processor is more powerful, as it embeds hardware and software therein that enable particular functionality with minimal or no reliance on external hardware and software. For example, the system 100 and/or associated functionality can be embedded within hardware in a SOC architecture.

The computer 802 also includes one or more interface components 870 that are communicatively coupled to the system bus 840 and facilitate interaction with the computer 802. By way of example, the interface component 870 can be a port (e.g., serial, parallel, PCMCIA, USB, FireWire, etc.) or an interface card (e.g., sound, video, etc.) or the like. In one example implementation, the interface component 870 can be embodied as a user input/output interface to enable a user to enter commands and information into the computer 802, for instance by way of one or more gestures or voice input, through one or more input devices (e.g., pointing device such as a mouse, trackball, stylus, touch pad, keyboard, microphone, joystick, game pad, satellite dish, scanner, camera, other computer, etc.). In another example implementation, the interface component 870 can be embodied as an output peripheral interface to supply output to displays (e.g., LCD, LED, plasma, etc.), speakers, printers, and/or other computers, among other things. Still further yet, the interface component 870 can be embodied as a network interface to enable communication with other computing devices (not shown), such as over a wired or wireless communications link.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A system, comprising:
at least one processor; and
a memory having computer-executable instructions stored thereupon which, when executed by the at least one processor, cause the system to:
receive first processed data of at least some of a plurality of data chunks of one or more data streams, wherein the first processed data is obtained by parallel processing of the one or more data streams;
receive second processed data of at least one parity chunk;
when it is determined that third processed data for a pre-defined quantity of data chunks has not been received from one or more particular processors by a pre-defined period of time, determine the third processed data for one or more particular data chunks based, at least in part, upon the second processed data of the at least one parity chunk and the first processed data of the at least some of the plurality of data chunks; and
provide the first processed data and the third processed data.

2. The system of claim 1, the memory having further computer-executable instructions stored thereupon which, when executed by the at least one processor, cause the system to:
partition a batch of processing stream data into the plurality of data chunks;
generate the at least one parity chunk for the plurality of data chunks; and
provide the plurality of data chunks and the at least one parity chunk to a plurality of processors for processing, the plurality of processors including the one or more particular processors from which the third processed data is not received by the pre-defined period of time and one or more other processors that perform the parallel processing to generate the first processed data.

3. The system of claim 1, the memory having further computer-executable instructions stored thereupon which, when executed by the at least one processor, cause the system to:
determine the pre-defined quantity based, at least in part, upon a quantity of data chunks for which the first processed data has been received.

4. The system of claim 2, the memory having further computer-executable instructions stored thereupon which, when executed by the at least one processor, cause the system to:
determine the pre-defined quantity based, at least in part, upon a quantity of parity data chunks for which the second processed data has been received.

5. The system of claim 1, wherein the at least one parity chunk is generated based upon a Reed-Solomon parity algorithm.

6. The system of claim 1, the memory having further computer-executable instructions stored thereupon which, when executed by the at least one processor, cause the system to:
determine the pre-defined period of time based, at least in part, upon a quantity of data chunks into which streaming data of the one or more data streams is partitioned and a quantity of parity chunks generated for the streaming data.

7. The system of claim 1, the memory having further computer-executable instructions stored thereupon which, when executed by the at least one processor, cause the system to:
dynamically adjust the pre-defined period of time based, at least in part, on at least one of an expected amount of time to determine the third processed data, a latency requirement, or a performance requirement.

8. A method, comprising:
receiving first processed data of at least some of a plurality of data chunks of one or more data streams, wherein the first processed data is produced by parallel processing of the one or more data streams by a plurality of processors;
receiving second processed data of at least one parity chunk;
in an instance when third processed data for a specified quantity of data chunks has not been received from one or more other processors, determining the third processed data for one or more particular data chunks based, at least in part, upon the second processed data of the at least one parity chunk and the first processed data of the at least some of the plurality of data chunks; and
providing the first processed data and the third processed data.

9. The method of claim 8, further comprising:
partitioning a batch of processing stream data into the plurality of data chunks;
generating the at least one parity chunk for the plurality of data chunks; and
providing the plurality of data chunks and the at least one parity chunk to the plurality of processors and the one or more other processors for processing.

10. The method of claim 8, further comprising:
determining the specified quantity based, at least in part, upon a quantity of data chunks for which the first processed data has been received.

11. The method of claim 10, further comprising:
determining the specified quantity based, at least in part, upon a quantity of parity data chunks for which the second processed data has been received.

12. The method of claim 8, wherein the at least one parity chunk is generated based upon a Reed-Solomon parity algorithm.

13. The method of claim 8, further comprising:
determining a specified period of time to wait for the third processed data from the one or more other processors based, at least in part, upon a quantity of data chunks into which streaming data of the one or more data streams is partitioned and a quantity of parity chunks generated for the streaming data; and
determining the third processed data when the specified period of time expires without receiving the third processed data from the one or more other processors.

14. The method of claim 13, further comprising:
dynamically adjusting the specified period of time based, at least in part, an expected amount of time to determine the third processed data.

15. A computer storage media storing computer-readable instructions that, when executed, cause a computing device to:
receive first processed data of at least some of a plurality of data chunks of one or more data streams, wherein the first processed data is obtained by parallel processing of the one or more data streams;
receive second processed data of at least one parity chunk;
in an instance when third processed data for a specified quantity of one or more particular data chunks has not been received from one or more particular processors, determine the third processed data for the one or more particular data chunks based, at least in part, upon the second processed data of at least one parity chunk and the first processed data of at least some of the plurality of data chunks; and
output the first processed data and the third processed data.

16. The computer storage media of claim 15 storing further computer-readable instructions that, when executed, cause the computing device to:
partition a batch of processing stream data into the plurality of data chunks;
generate the at least one parity chunk for the plurality of data chunks; and
provide the plurality of data chunks and the at least one parity chunk to a plurality of processors for processing, the plurality of processors including the one or more particular processors.

17. The computer storage media of claim 15, storing further computer-readable instructions that, when executed, cause the computing device to:
determine the specified quantity based, at least in part, upon a quantity of data chunks for which the first processed data has been received.

18. The computer storage media of claim 17, storing further computer-readable instructions that, when executed, cause the computing device to:
determine the specified quantity based, at least in part, upon a quantity of parity data chunks for which the second processed data has been received.

19. The computer storage media of claim 15, wherein the at least one parity chunk is generated based upon a Reed-Solomon parity algorithm.

20. The computer storage media of claim 15, wherein the second processed data is produced by parallel processing of the at least one parity chunk by one or more other processors that also produce the first processed data.

* * * * *